(12) United States Patent
Wu et al.

(10) Patent No.: US 9,646,978 B2
(45) Date of Patent: May 9, 2017

(54) SELF-ALIGNED FLASH MEMORY DEVICE WITH WORD LINE HAVING REDUCED HEIGHT AT OUTER EDGE OPPOSITE TO GATE STACK

(71) Applicant: Taiwan Semiconductor Manufacturing Co., Ltd., Hsin-Chu (TW)

(72) Inventors: Chang-Ming Wu, New Taipei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/729,553

(22) Filed: Jun. 3, 2015

(65) Prior Publication Data

US 2016/0358928 A1 Dec. 8, 2016

(51) Int. Cl.

| | |
|---|---|
| H01L 27/115 | (2006.01) |
| H01L 27/11519 | (2017.01) |
| H01L 27/11521 | (2017.01) |
| H01L 29/423 | (2006.01) |
| H01L 23/528 | (2006.01) |
| H01L 21/768 | (2006.01) |
| H01L 29/788 | (2006.01) |
| H01L 29/78 | (2006.01) |

(52) U.S. Cl.
CPC .... *H01L 27/11519* (2013.01); *H01L 21/7684* (2013.01); *H01L 21/76831* (2013.01); *H01L 21/76883* (2013.01); *H01L 23/5283* (2013.01); *H01L 27/11521* (2013.01); *H01L 29/42328* (2013.01); *H01L 29/788* (2013.01); *H01L 29/7831* (2013.01)

(58) Field of Classification Search
CPC .................................................. H01L 29/788
See application file for complete search history.

(56) References Cited

U.S. PATENT DOCUMENTS

| 8,669,607 | B1 * | 3/2014 | Tsair | H01L 29/7881 |
| | | | | 257/316 |
| 9,159,842 | B1 * | 10/2015 | Wu | H01L 29/66825 |
| 2008/0217675 | A1 * | 9/2008 | Liu | H01L 21/28273 |
| | | | | 257/321 |
| 2011/0248328 | A1 * | 10/2011 | Shen | H01L 21/28273 |
| | | | | 257/316 |
| 2013/0242659 | A1 * | 9/2013 | Yu | H01L 29/788 |
| | | | | 365/185.14 |
| 2014/0091382 | A1 * | 4/2014 | Tadayoni | H01L 21/28273 |
| | | | | 257/320 |

\* cited by examiner

*Primary Examiner* — Stephen W Smoot
(74) *Attorney, Agent, or Firm* — Eschweiler & Potashnik, LLC

(57) ABSTRACT

The present disclosure relates to a flash memory device, and associated methods. In some embodiments, the flash memory device has a gate stack with a control gate separated from a floating gate by a control gate dielectric. An erase gate disposed on a first side of the gate stack. A word line is disposed on a second side of the gate stack that is opposite the first side. The word line has a height that monotonically increases from an outer side opposite to the gate stack to an inner side closer to the gate stack. The shape of the word line optimizes the contact resistance of the word line and allows for an overlying cap spacer formed on the word line to be well defined, which can provide more reliable read/write operations and/or better performance.

20 Claims, 17 Drawing Sheets

SELF-ALIGNED FLASH MEMORY DEVICE WITH WORD LINE HAVING REDUCED HEIGHT AT OUTER EDGE OPPOSITE TO GATE STACK

BACKGROUND

Flash memory is an electronic non-volatile computer storage medium that can be electrically erased and reprogrammed. It is used in a wide variety of electronic devices. To store information, flash memory includes an addressable array of memory cells having charge storage components. Common types of flash memory cells include stacked gate memory cells, two transistor memory cells and split gate memory cells. Compared to two transistor cells, split gate memory cells have a smaller area. Compared to stacked gate memory cells, split gate memory cells have higher injection efficiency, less susceptibility to short channel effects, and better over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
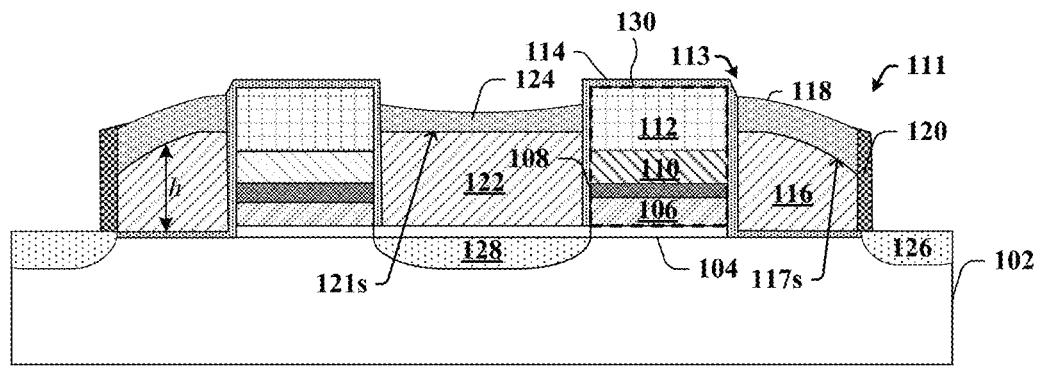
FIG. 1 illustrates a cross-sectional view of some embodiments of a flash memory device having a word line with a convex upper surface.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated circuits have an array of flash memory cells embedded within a same substrate as logic elements (e.g., processors, peripherals, etc.) that support operation of the flash memory cells. Typically, the array of flash memory cells comprises a large number of pairs of split-gate flash memory cells (e.g., EFS3 memory cells) arranged in rows and columns. In some designs, a pair of split-gate flash memory cells has a common source/drain region that is shared by the cells of the pair. First and second individual source/drain regions are located on opposite sides of the common source/drain region, resulting in a first channel region extending between the first individual S/D region and the common S/D region and a second channel region extending between the common S/D region and the second individual S/D region. A first word line, corresponding to the first memory cell, is arranged over the first channel region, while a second word line corresponding to the second memory cell is arranged over the second channel region.

During manufacture of a split-gate flash memory cell, word lines are formed prior to forming the individual source/drain regions through ion implantation with the word lines in place. The word lines are formed to have a sufficient thickness to block implanted ions from reaching the first and second channel regions. In some approaches, the word lines may have top surfaces that are concave in shape, resulting in "pulled up" outer edges of the word lines that provide sufficient thickness to block implanted ions. However, such a concave shape negatively impacts the contact resistance of the word lines, since the concave shapes makes it more difficult for an overlying contact to make good contact with the word line or an overlying silicide layer (e.g., the concave surface may leave voids between some regions between a contact and a word line). Furthermore, the "pulled up" outer edges of the word lines result in the formation of unwanted humps in an overlying dielectric layer which make formation of cap spacers and/or sidewalls spacers (e.g., between adjacent memory cells) more difficult.

Accordingly, the present disclosure relates to an improved integrated circuit having an embedded flash memory device with a world line having a convex upper surface, and associated processing methods. The flash memory device comprises a word line located along a side of a gate stack and an erase gate disposed on an opposite, second side of the gate stack. The word line has an upper surface with a monotonically increasing height from an outer side opposite to the gate stack to an inner side closer to the gate stack. The shape of the word line improves contact resistance by improving electrical contact between an overlying conductive contact and the word line, and also eliminates "pulled-up" edges that complicate formation of a cap spacer overlying the word line, thereby providing more reliable read/write operations and/or better performance.

FIG. 1 shows some embodiments of a cross-sectional view of a flash memory device 100.

The flash memory device 100 comprises source/drain regions 126 and 128 arranged within a semiconductor substrate 102. In some embodiment, the source/drain regions may comprise a common source/drain region 128 laterally positioned between individual source/drain regions 126. A gate stack 130 is located over the semiconductor substrate 102. The gate stack 130 is laterally disposed between the source/drain regions, 126 and 128, and is vertically separated from the semiconductor substrate 102 by a gate dielectric layer 104. The gate stack 130 comprises a control gate 110 that is separated from a floating gate 106 by a control gate dielectric 108. In some embodiments, the gate stack 130 may further include a hard mask 112 disposed over the control gate 110. In some embodiments, the hard mask 112 may comprise silicon nitride or silicon oxynitride, for example.

An erase gate 122 is disposed on a first side of the gate stack 130 overlying the common source/drain region 128. The erase gate 122 is vertically separated from the common source/drain region 128 by the gate dielectric layer 104. The erase gate 122 is laterally separated from the gate stack 130 by a dielectric liner 114 (e.g., silicon dioxide). In some embodiments, the erase gate 122 may have a planar upper surface 121s. A word line 116 is disposed on a second side of the gate stack 130 that is opposite the first side. The word line 116 may be separated from the gate stack 130 by the dielectric liner 114. In some embodiments, the erase gate 122 and the word line 116 may comprise a same material and/or share a same crystalline structure. For example, in some embodiments, the word line 116 and/or the erase gate 122 may comprise doped polysilicon. In other embodiments, the word line 116 and/or the erase gate 122 may comprise other conductive materials such as metal, for example.

A height h of the word line 116 monotonically increases from an outer side 111 (i.e., a side of the word line 116 that is opposite to the gate stack 130) to an inner side 113 closer to the gate stack 130. In other words, the height h of the word line 116 does not decrease from the outer side 111 to the inner side 113, although it may be flat at some parts (e.g., at one or both edges). In some embodiments, a slope of an upper surface 117s of the word line 116 may decrease from the outer side 111 to the inner side 113, thereby giving the word line 116 a convex shape. The convex shape of the word line 116 provides for sufficient thickness to block source/drain implants used during fabrication of the flash memory device 100 to from the source/drain regions, 126 and 128, while also providing the word line 116 with an upper surface profile that allows for good contact between an overlying contact and the word line.

A sidewall spacer 120 may be disposed along an outer sidewall of the word line 116. In some embodiments, a word line cap spacer 118 can be disposed over the word line 116 and an erase gate cap spacer 124 can be disposed over the erase gate 122. In some embodiments, the word line cap spacer 118, the erase gate cap spacer 124, and the sidewall spacer 120 may comprise a same dielectric material or different dielectric materials. For example, the word line cap spacer 118 and the erase gate cap spacer 124 may comprise silicon dioxide and the sidewall spacer 120 may comprise silicon nitride.

Figure 2:
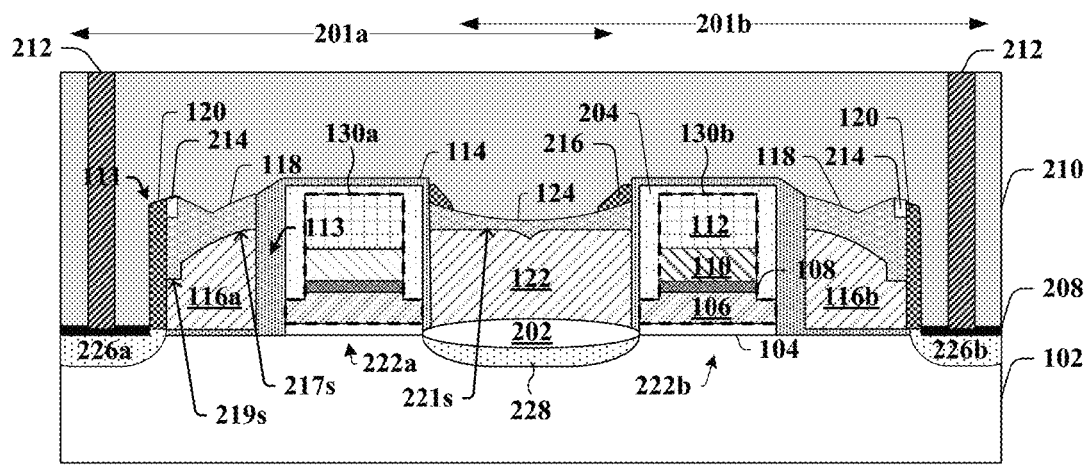
FIG. 2 illustrates a cross-sectional view of some other embodiments of a flash memory device having a word line with a convex upper surface.

FIG. 2 shows some embodiments of a cross-sectional view of a flash memory device 200 disposed over a substrate.

The flash memory device 200 comprises a first flash memory cell 201a and a second flash memory cell 201b configured to respectively store one or more bits of data in a non-volatile manner. In some embodiments, the first flash memory cell 201a and the second flash memory cell 201b can be mirror images of one another about a central axis. A common source/drain region 228 is laterally arranged between first and second individual source/drain regions, 226a and 226b, within the semiconductor substrate 102. The common source/drain region 228 is separated from the first individual source/drain region 226a by a first channel region 222a, and is separated from the second individual source/drain region 226b by a second channel region 222b.

Gate stacks 130 are respectively disposed over the channel regions 222 and are separated from the channel regions 222 by gate dielectric layers 104. For example, a first gate stack 130a is disposed over the first channel region 222a and a second gate stack 130b is disposed over the second channel region 222b. In some embodiments, the gate stack 130 comprises a floating gate 106 and a control gate 110 separated by a control gate dielectric 108. A hard mask 112 can also be arranged over the control gate 110, and a dielectric cap 204 can cover the hard mask 112, sidewalls of the control gate 110, sidewalls of the control gate dielectric 108, and rest on a floating gate ledge within the floating gate 106. The floating gate ledge has a reduced height compared to a central region of the floating gate 106.

A first word line 116a is disposed on one side of the first gate stack 130a and a second word line 116b is disposed on one side of the second gate stack 130b. In some embodiments, the word line 116 comprises a ledge at an outer side 111 and a tilted portion at an inner side 113 of the word line 116. The ledge may have a planar upper surface 219s and the titled portion may have an upper surface 217s with a continuously upwardly sloping contour. In some embodiments, the planar upper surface 219s of the ledge can be lower than the upper surface 217s, so that the upper surface 217s is connected to the planar upper surface 219s by a substantially vertical sidewall.

An erase gate 122 is disposed between the other sides of the first and second gate stacks 130a, 130b directly above the common source/drain region 228, with an erase gate dielectric 202 separating the erase gate 122 from the common source/drain region 228. In some embodiments, the erase gate 122 has an upper surface 221s with a greater height at a peripheral region than a central region. An erase gate cap spacer 124 can be disposed directly above the erase gate 122. In some embodiments, a sidewall segment 216 can be disposed at a peripheral region of the erase gate cap spacer 124, abutting a dielectric liner 114.

A word line cap spacer 118 may be disposed on the word line 116. A dielectric segment 214 may be disposed at an upper outer edge of the word line cap spacer 118. The dielectric segment 214 is configured to help the word line 116 to be formed with a sufficient thickness at the outer side 111. In some embodiments, the word line cap spacer 118 and the dielectric segment 214 can be made of different materials. For example, the word line cap spacer 118 can be made of silicon dioxide and the dielectric segment 214 can be made of silicon nitride. A sidewall spacer 120 may be disposed along an outer sidewall of the word line 116. In some embodiments, the sidewall spacer 120 and the sidewall segment 216 can be made of same material, for example, silicon nitride.

An interlayer dielectric (ILD) layer 210 can be arranged over the gate stack 130, the erase gate 122, and the word line 116. A silicide pad 208 can be arranged over the source/drain region 126 and a conductive contact 212 can extend through the ILD layer 210 coupled to the silicide pad 208. In some embodiments, additional conductive contact 212 outside of the plane of the illustrated cross-section extend downward through the ILD layer 210 to source/drain regions 126, word line 116, and erase gate 122.

During operation, the memory cells, 201a and 201b, independently store variable amounts of charge (e.g., electrons) in floating gates, 106a and 106b, respectively. The amount of charge stored on the floating gates, 106a and 106b, represents data states stored in the respective cells 201a, 201b, and can be varied through program, read, and erase operations. For example, during a program operation, a word line bias (e.g., +1V) is applied to the word line 116 and a larger magnitude voltage (e.g., +11V) is applied to the control gate 110, thereby inducing formation of a conductive channel in the channel region 222. While this bias condition is applied, a positive voltage (e.g., +5 volt) is concurrently applied to both the common source/drain region 228 and erase gate 122 to induce electrons to flow from the individual S/D region 226 towards the common S/D region 228. The high bias voltage on the control gate 110 promotes Fowler-Nordheim tunneling of carriers from the channel region 222 towards the control gate 110. As the carriers tunnel towards the control gate 110, at least some carriers become trapped in the floating gate 106, and thus alter the voltage threshold of the memory cell 201 to correspond to a predetermined voltage threshold associated with a program data state (e.g., logical "1").

During an erase operation of the memory cell 201, the erase gate 122 is biased with a high voltage (e.g., +13V) while the control gate 110 and the word line 116 are held at a low voltage (e.g., 0 V). The high bias erase gate voltage promotes Fowler-Nordheim tunneling of carriers from the floating gate 106 towards the erase gate 122. As the carriers tunnel towards the erase gate 122, electrons in the floating gate 106 are now removed from the floating gate 106, altering the voltage threshold of the memory cell 201 to correspond to a predetermined voltage threshold associated with an erase data state (e.g., logical "0").

Because charge stored in the floating gate 106 screens an electric field formed between the control gate 110 and the channel region 222, the charge stored on the floating gate 106 can alter the threshold voltage $V_{th}$ of the memory cell 201 by an amount $\Delta V_{th}$. Therefore, during a read operation of the memory cell 201, the word line 116 is biased (e.g., +3V) and the control gate 110 is biased with a read voltage (e.g., +2V), which is greater than $V_{th}$, but less than $V_{th}$+ $\Delta V_{th}$. Depending on whether current flows between the individual S/D region 226 and the common S/D region 228 (or not), read circuitry of the memory device can correspondingly determine whether the memory cell 201 is in the program state (e.g., logical "1") or erase state (logical "0").

Figure 3:
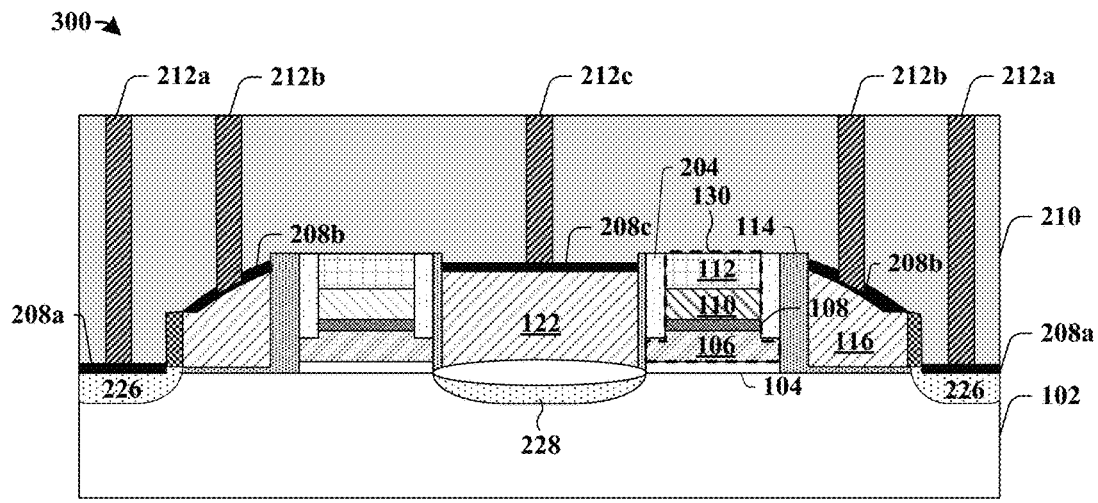
FIG. 3 illustrates a cross-sectional view of some other embodiments of a flash memory device having a word line with a convex upper surface.

FIG. 3 shows some embodiments of a cross-sectional view of a flash memory device 300 disposed over a substrate.

The flash memory device 300 comprises gate stacks 130 arranged between a common source/drain (S/D) region 228 and individual S/D regions 226. An erase gate 122 is disposed on one side of the gate stack 130 overlying the common S/D region 228 and a word line 116 is disposed on the other side of the gate stack 130 abutting the individual S/D region 226. In some embodiments, the word line 116 has a monotonically upwardly sloping upper surface from an outer side opposite to the gate stack 130 to an inner side closer to the gate stack 130. The word line 116 can further comprise a ledge at the outer side having a planar upper surface.

A first silicide pad 208a can be disposed at an upper region of the individual S/D region 226. A second silicide pad 208b can be disposed to abut the upper surface of the word line 116. A third silicide pad 208c can be disposed to abut an upper surface of the erase gate 122. Corresponding contacts 212a, 212d, 212c can be disposed through an interlayer dielectric (ILD) layer 210 and reach the silicide pads 208a, 208b, 208c, respectively. In some embodiments, the word line 116 and the erase gate 122 are not covered by cap spacers, so that the silicide pads 208 abut the ILD layer 210.

Figure 4:
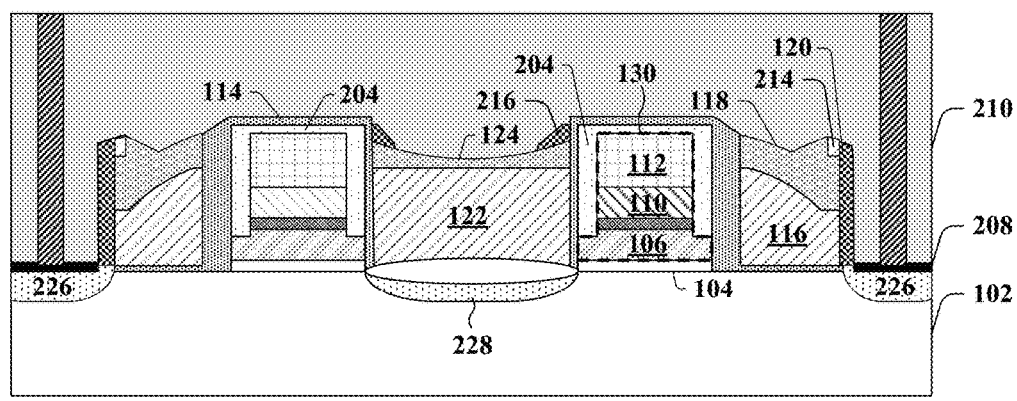
FIG. 4 illustrates a cross-sectional view of some other embodiments of a flash memory device having a word line with a convex upper surface.

FIG. 4 shows some embodiments of a cross-sectional view of a flash memory device 400 disposed over a substrate.

The flash memory device 400 comprises an erase gate 122 disposed on one side of the gate stack 130 and a word line 116 disposed on the other side of the gate stack 130. The erase gate overlies the common S/D region 228 and has a substantially planar upper surface that abuts an overlying erase gate cap spacer 124 with a concave upper surface. The word line 116 comprises a ledge at a peripheral region having a planar upper surface. The curved upper surface extends outward from the ledge (i.e., the upper surface has a curvature that begins from a height of the ledge).

In some embodiments, silicide pads 208 can be arranged over the S/D region 226 and a conductive contact 212 can extend through an ILD layer 210 to the silicide pad 208. In contrast to flash memory device 300, there are no silicide pads formed on the word line 116 and the erase gate 122. In some embodiments, flash memory devices 300 and 400 can be located within different regions of a same integrated chip. For example, the salicided flash memory device 300 may be located within a peripheral region surrounding a region having non-salicided flash memory device 400. A selected contact region of the word lines (possibly also erase gates) are silicide to form better connection while remaining regions outside the contact region are protected by cap spacers to eliminate metal contamination and improve liability of the flash memory device.

Figure 5:
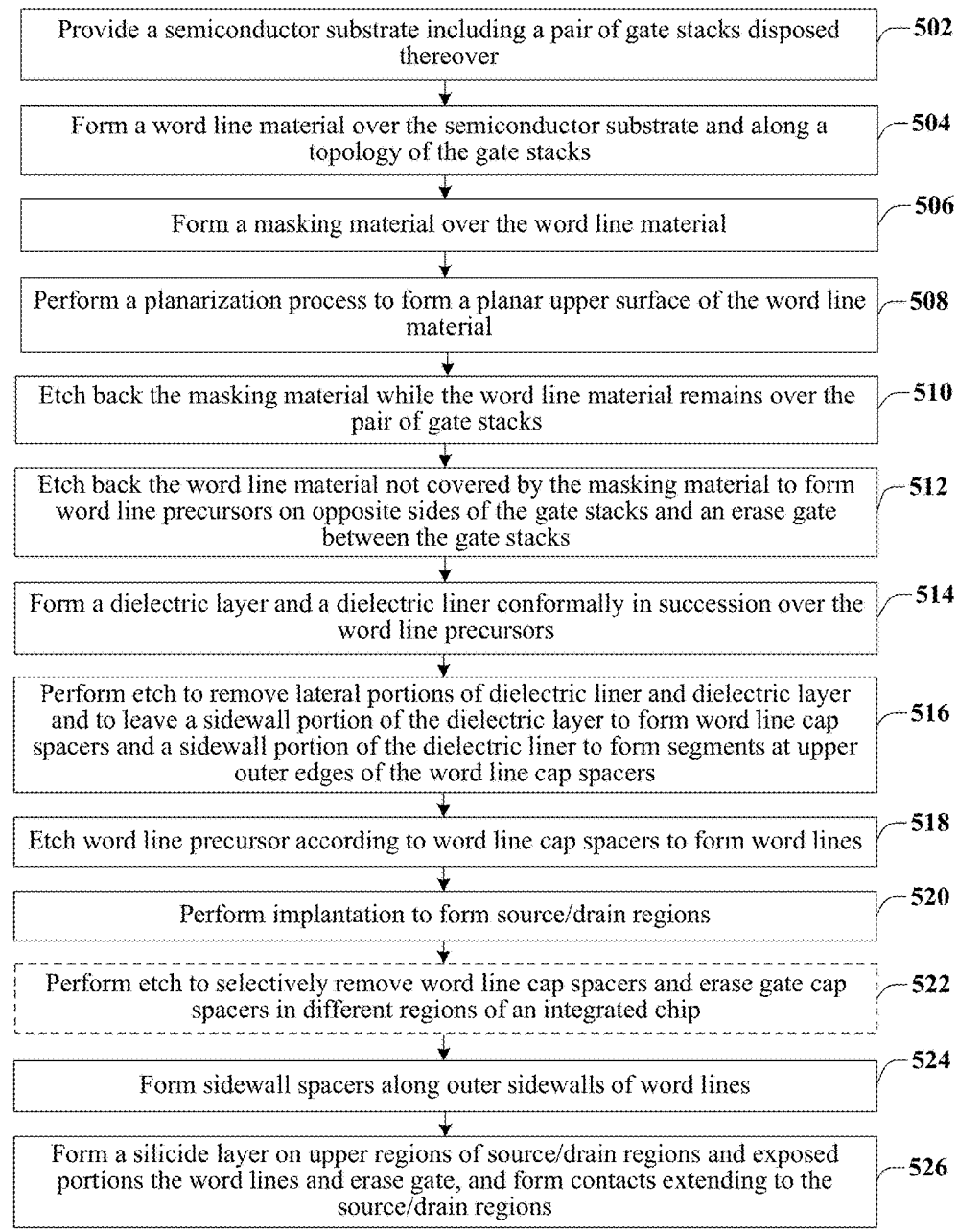
FIG. 5 illustrates a flow diagram of some embodiments of a method of forming a flash memory cell having a word line with a convex upper surface.

FIG. 5 shows some embodiments of a flow diagram of a method 500 of forming a flash memory device. While disclosed methods (e.g., methods 500 and 2100) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, a semiconductor substrate is provided including a pair of gate stacks disposed thereover.

At 504, a word line material is formed over the semiconductor substrate and along a topology of the gate stacks.

At 506, a masking material is formed over the word line material.

At 508, a planarization process is performed to form a planar upper surface of the word line material.

At 510, the masking material is etched back while the word line material remains over the pair of gate stacks.

At 512, the word line material not covered by the masking material is etched back to form word line precursors on opposite sides of the gate stacks and an erase gate between the gate stacks.

At 514, a dielectric layer and a dielectric liner are formed conformally in succession over the word line precursors.

At 516, an etch is performed through the dielectric liner and the dielectric layer to remove lateral portions and to leave a sidewall portion of the dielectric layer to form word line cap spacers and a sidewall portion of the dielectric liner to form segments at upper outer edges of the word line cap spacers.

At 518, the word line precursor is etched according to the word line cap spacers to form the word lines.

At 520, an implantation process is performed to form source/drain regions within the semiconductor substrate.

At 522, an etch process is performed to selectively remove the word line cap spacers and the erase gate cap spacers in different regions of an integrated chip.

At 524, sidewall spacers are formed along outer sidewalls of the word lines.

At 526, a silicide layer is formed on upper regions of source/drain regions and exposed portions the word lines and erase gate, and contacts are formed within an ILD layer to extend to the source/drain regions.

FIGS. 6-20B show some cross-sectional views of a method of forming a pair of split gate memory cells according to some embodiments. Although FIGS. 6-20B are described in relation to method 500, it will be appreciated that the structures disclosed in FIGS. 6-20B are not limited to such a method.

Figure 6:
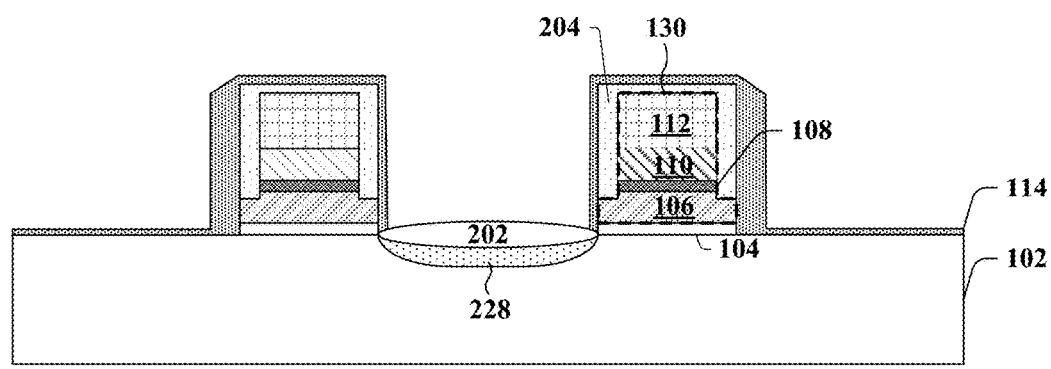
FIGS. 6-20B illustrate some embodiments of cross-sectional views of a method of forming a flash memory cell having a word line with a convex upper surface.

FIG. 6 illustrates some embodiments of a cross-sectional view 600 corresponding to act 502.

As illustrated by cross-sectional view 600, a semiconductor substrate 102 is provided including a pair of gate stacks 130 disposed thereover. The gate stacks 130 comprise a control gate 110 separated from a floating gate 106 by a control gate dielectric 108. A hard mask 112 can be arranged over the control gate 110 and a dielectric cap 204 can be arranged overlying the hard mask 112 and cover sidewalls of the hard mask 112, the control gate 110, and the control gate dielectric 108. In some embodiments, the hard mask 112 abuts an upper surface of the floating gate 106. A dielectric liner 114 is arranged to cover sidewalls and top surface of the dielectric cap 204. A common S/D region 228 is formed between the pair of gate stacks 130 and an erase gate dielectric 202 is formed over the common S/D region 228.

Figure 7:
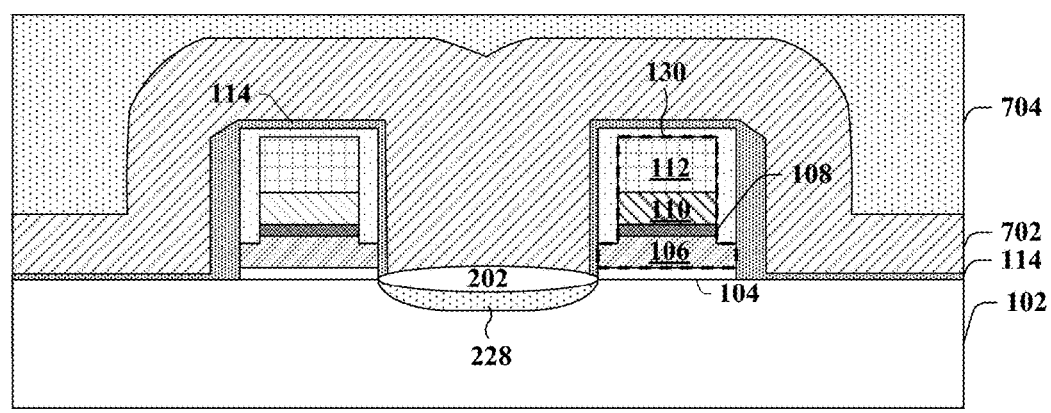

FIG. 7 illustrates some embodiments of a cross-sectional view 700 corresponding to acts 504-506.

As illustrated by cross-sectional view 700, a word line material 702 is formed over the semiconductor substrate 102 and along a topology of the gate stacks 130. The word line material 702 is conformally formed over the dielectric liner 114 and the erase gate dielectric 202. A masking material 704 is formed over the word line material 702. The masking material 704 can be a photoresist material formed by a spin-on process to have a substantially planar upper surface. In some embodiments, the word line material 702 comprises doped polysilicon.

Figure 8:
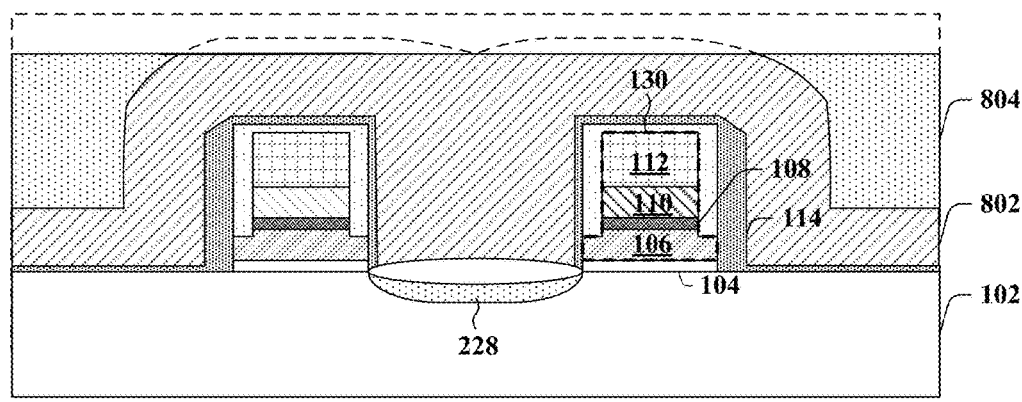

FIG. 8 illustrates some embodiments of a cross-sectional view 800 corresponding to act 508.

As illustrated by cross-sectional view 800, a planarization process is performed to form a planar upper surface of the word line material 802. In some embodiments, the planarization process comprises a dry etching process, which is substantially non-selective to the word line material 802 and the masking material 804. In other embodiments, the planarization process may comprise a chemical mechanical polishing process.

Figure 9:
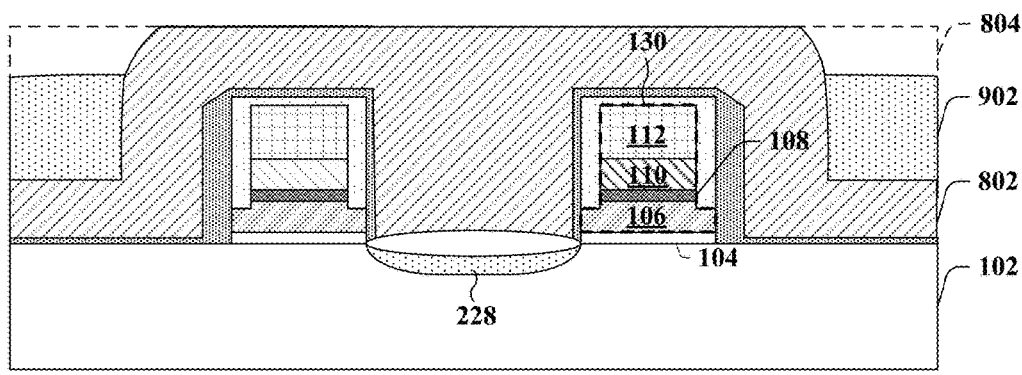

FIG. 9 illustrates some embodiments of a cross-sectional view 900 corresponding to act 510.

As illustrated by cross-sectional view 900, the masking material 902 is etched back while the word line material 802 remains over the pair of gate stacks 130. The etch back process can be high selective to the word line material 902. The masking material 902 is lowered to protect a peripheral region of the flash memory device while a curved sidewall of the word line material 802 is exposed. In some embodiments, the masking material 902 can be etched back by a dry etchant comprising oxygen as one of the react gases.

Figure 10:
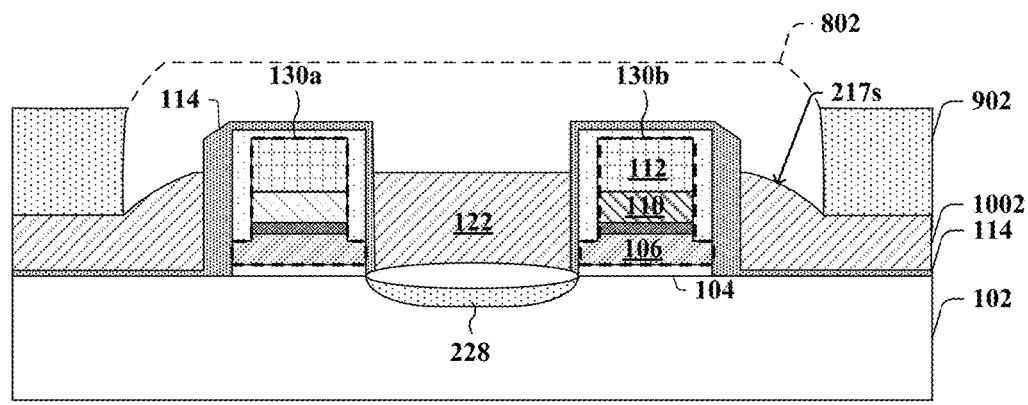
Figure 11:
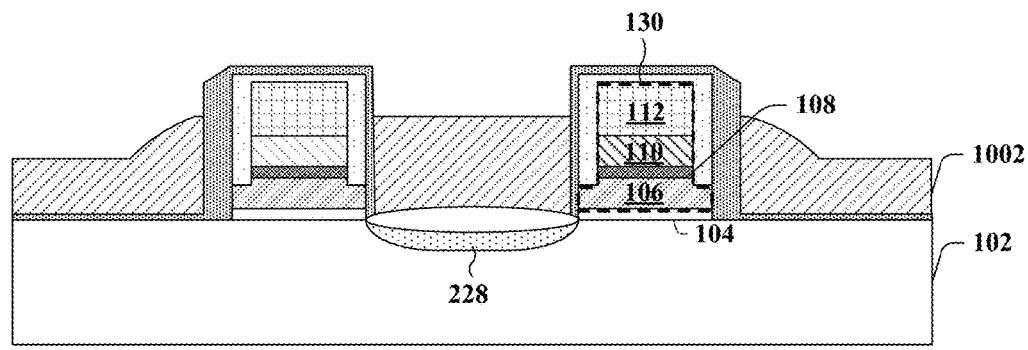

FIGS. 10-11 illustrate some embodiments of cross-sectional views, 1000 and 1100, corresponding to act 512.

As illustrated by cross-sectional view 1000, the word line material 802 not covered by the masking material 902 is etched back to form word line precursors 1002 on opposite sides of the gate stacks 130a, 130b and an erase gate 122 between the gate stacks, 130a and 130b. The word line precursor 1002 is formed by etching the word line material 1002 uniformly and a curved upper surface 217s is formed directly under the previous curved sidewall. Notably, different from some other approaches, a dielectric liner (e.g. formed by atomic layer deposition) is not formed on the word line precursor 1002, such that a curved contour of the word line material at one side of the gate stack 130 can be kept after the etch back process. The upper surface 217s can have a continuously upwardly sloping contour from an outer side opposite to the gate stack 130 to an inner side closer to the gate stack 130. The erase gate 122 can have a planar upper surface. As illustrated by cross-sectional view 1100, the masking material 902 is then removed.

Figure 12:
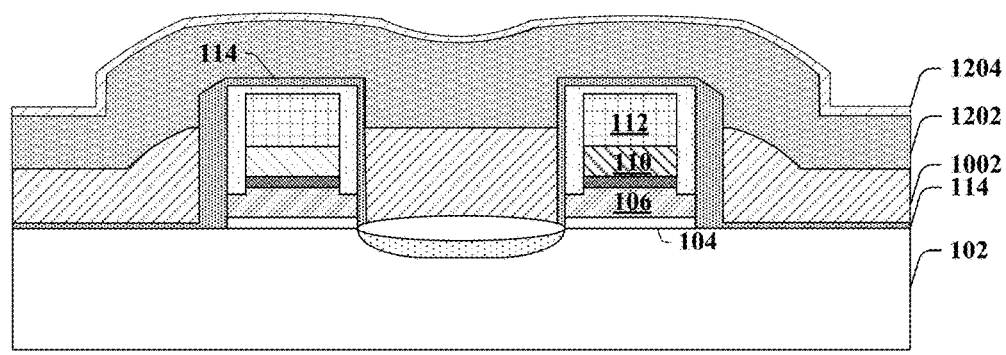

FIG. 12 illustrates some embodiments of a cross-sectional view 1200 corresponding to act 514.

As illustrated by cross-sectional view 1200, a dielectric layer 1202 and a dielectric liner 1204 are formed conformally in succession over the word line precursor 1002. In some embodiments, the dielectric layer 1202 can comprise silicon oxide and the dielectric liner 1204 can comprise silicon nitride. The dielectric layer 1202 can be formed by deposition techniques such as chemical vapor deposition (CVD) or physical vapor deposition (PVD). The dielectric liner 1204 can be formed by atomic layer deposition (ALD).

Figure 13:
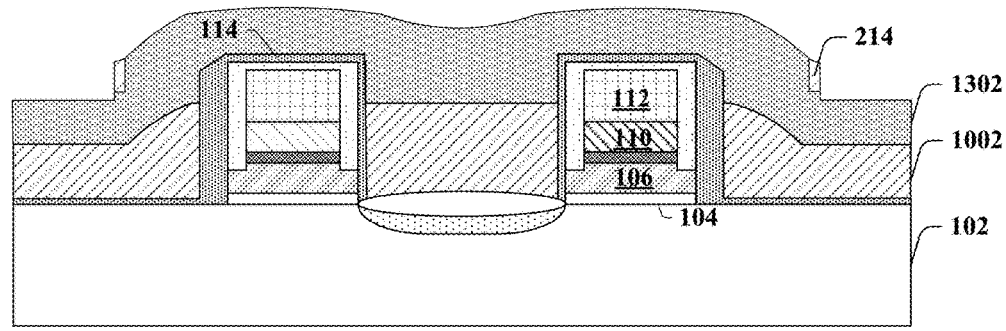
Figure 14:
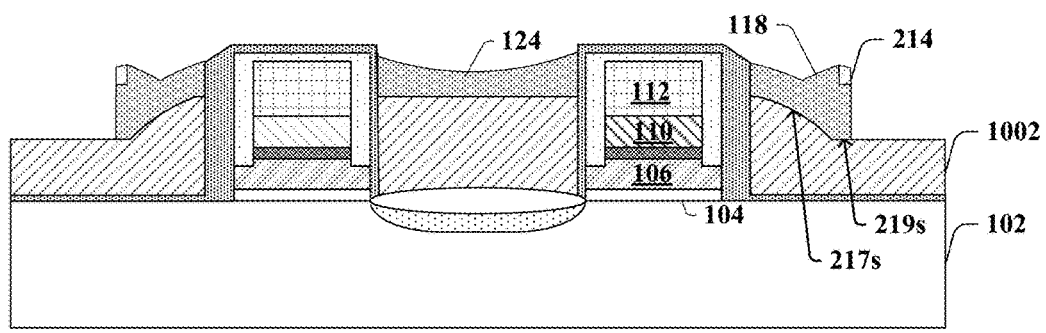

FIGS. 13-14 illustrate some embodiments of cross-sectional views, 1300 and 1400, corresponding to act 516.

As illustrated by cross-sectional view 1300, a first etch is performed through the dielectric liner (e.g., 1204 of FIG. 12) to remove lateral portions and to leave a sidewall portion of the dielectric liner to form dielectric segments 214. The dielectric layer 1302 is also lowered by the etching process such that lower sidewalls abutting the dielectric segments 214 are exposed.

As illustrated by cross-sectional view 1400, a second etch is performed through the dielectric layer (e.g., 1302 of FIG. 13) to remove lateral portions and to leave a sidewall portion of the dielectric layer to form word line cap spacers 118 on opposite sides of the gate stacks 130 and an erase gate cap spacer 124 between gate stacks 130. In some embodiments, the word line cap spacers 118 cover the curved upper surface 217s and a neighboring small portion of a planar upper surface 219s of the word line precursor 1002. In some embodiments, upper sidewalls of the word line cap spacers 118 and the erase gate cap spacer 124 have a concave shape with a center region is lower than a peripheral region.

Figure 15:
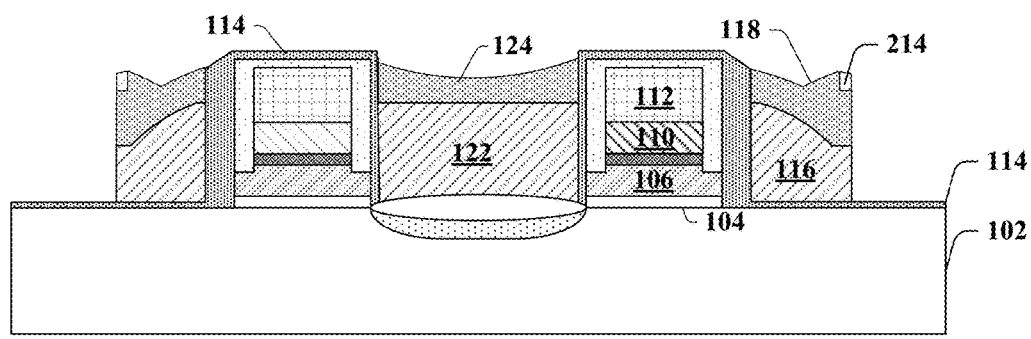

FIG. 15 illustrates some embodiments of a cross-sectional view 1500 corresponding to act 518.

As illustrated by cross-sectional view 1500, the word line material (e.g., 1002 of FIG. 14) is etched according to the word line cap spacers 118 to form the word lines 116.

Figure 16:
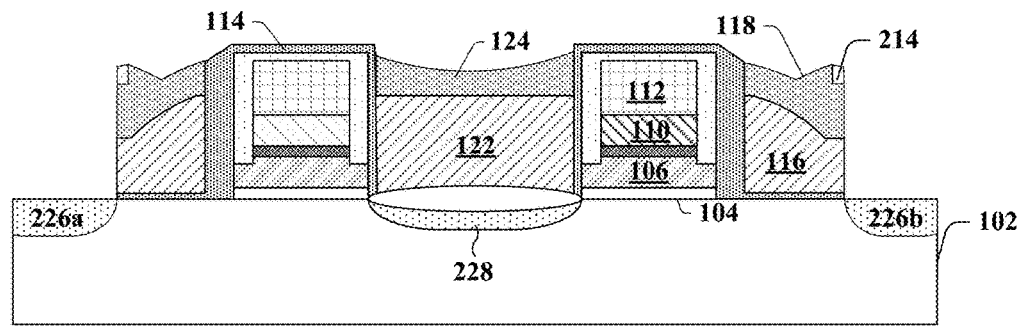

FIG. 16 illustrates some embodiments of a cross-sectional view 1600 corresponding to act 520.

As illustrated by cross-sectional view 1600, S/D regions 126 are formed within an upper region of the semiconductor substrate 102 at the opposite sides of the word lines 116. In some embodiments, the S/D regions 126 may be formed by selectively implanting dopant species into the semiconductor substrate 102.

Figure 17:
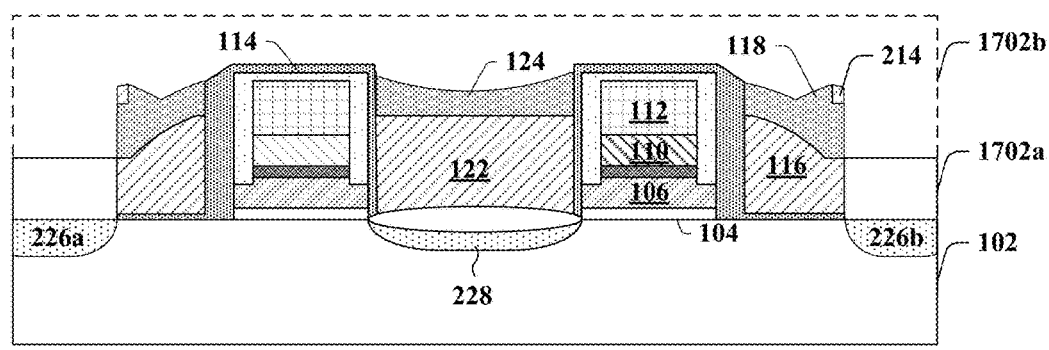
Figure 18A:
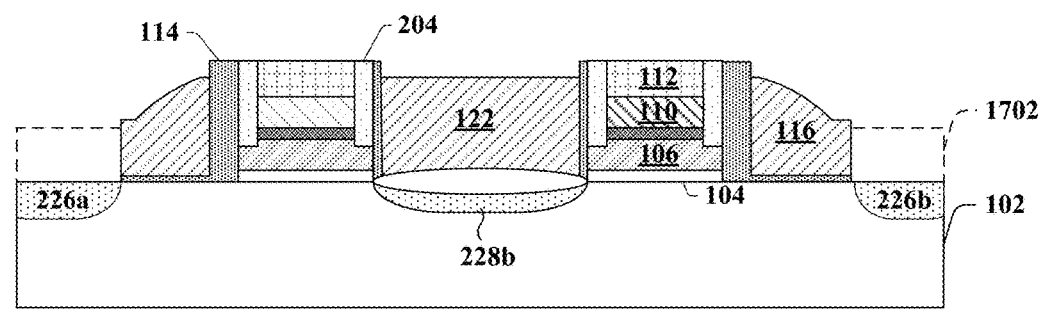
Figure 18B:
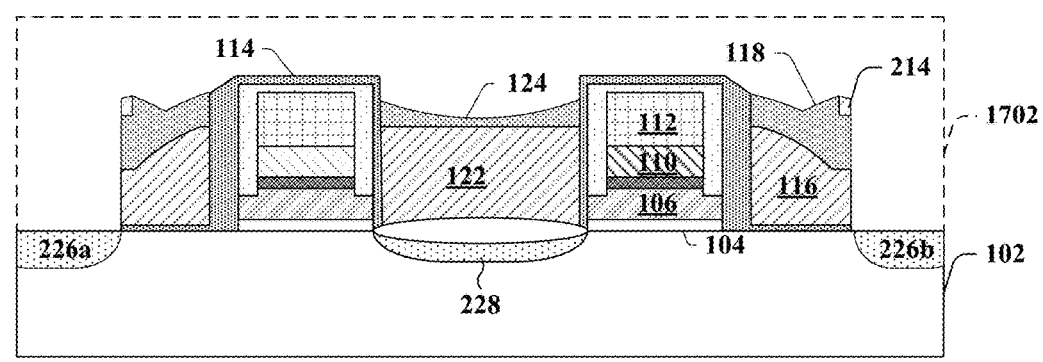

FIGS. 17 and 18A-18B illustrate some embodiments of cross-sectional views corresponding to act 522.

As illustrated by cross-sectional view 1700, a photoresist layer 1702 is formed over the semiconductor substrate 102. The photoresist layer 1702 may be patterned to have different coverage of flash memory cells in different regions of an integrated chip. For example, a portion of the photoresist layer 1702a disposed over a first region of an integrated chip covers the source/drain region 226 without covering the word line cap spacers 118 or the dielectric liner 114, while a portion of the photoresist layer 1702b disposed over a second region of an integrated chip covers the source/drain region 226, the word line cap spacers 118, and the dielectric liner 114.

As illustrated by cross-sectional view 1800a, an etch is performed to partially remove the word line cap spacers 118 and the erase gate cap spacers 124 within the first region of the integrated chip. As illustrated by cross-sectional view 1800b the word line cap spacers 118 and the erase gate cap spacers 124 outside the contact region are protected by the photoresist layer 1702 and not altered by the etch.

Figure 19A:
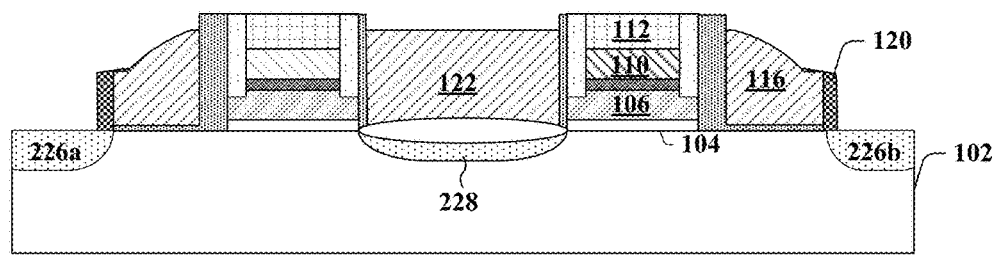
Figure 19B:
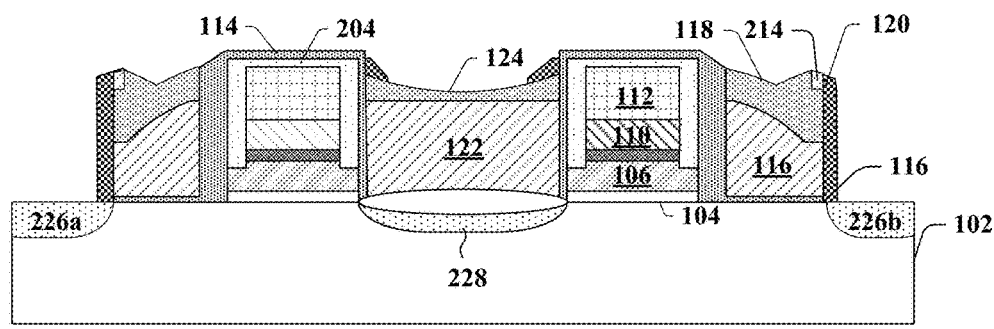

FIGS. 19A-B illustrates some embodiments of cross-sectional views, 1900a and 1900b, corresponding to act 524.

As illustrated by cross-sectional view 1900a, sidewall spacers 120 are formed along outer sidewalls of the word lines 116. The sidewall spacers 120 cover a sidewall of the word line 116 over the contact region. As illustrated by cross-sectional view 1900b the sidewall spacers 120 extends upwardly to the word line cap spacers 118 and overlie the erase gate cap spacers 124 outside the contact region as shown by FIG. 19B.

Figure 20A:
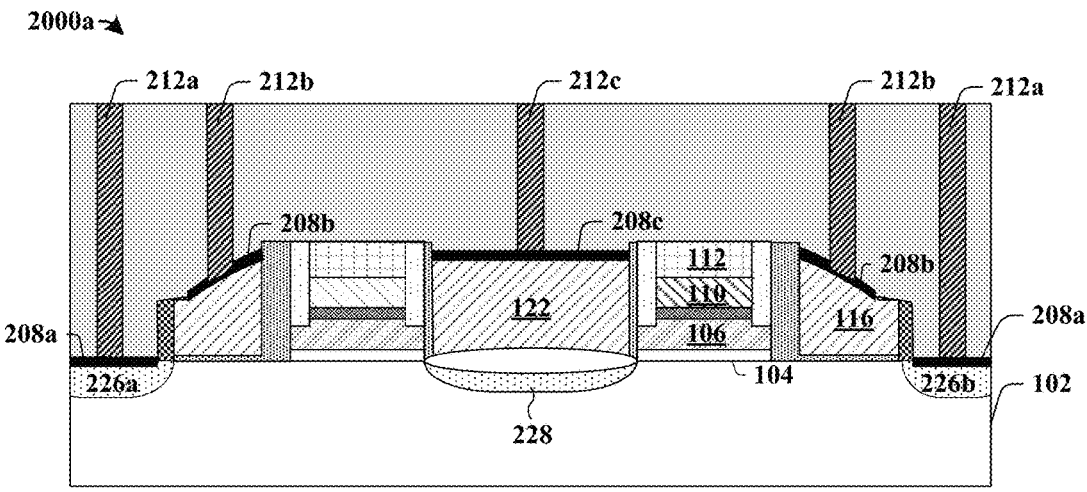
Figure 20B:
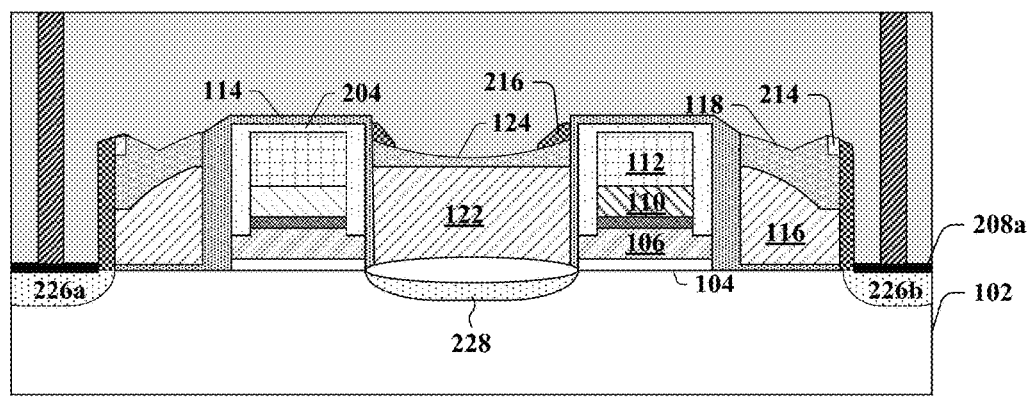

FIGS. 20A-B illustrates some embodiments of cross-sectional views, 2000a and 2000b, corresponding to act 526.

As illustrated by cross-sectional view 2000a, a silicide layer 208 comprising first silicide pads 208a, second silicide pads 208b and third silicide pads 208c are formed on upper regions of S/D regions 126, the word lines 116 and the erase gate 122. Conductive contacts 212 comprising a first contact 212a, a second contact 212b, and a third contact 212c are formed extending to the silicide layer 208.

As illustrated by cross-sectional view 2000b, upper regions of the S/D regions 126 are silicided, while the word lines 116 and the erase gate 122 are protected from silicide outside the contact region.

Figure 21:
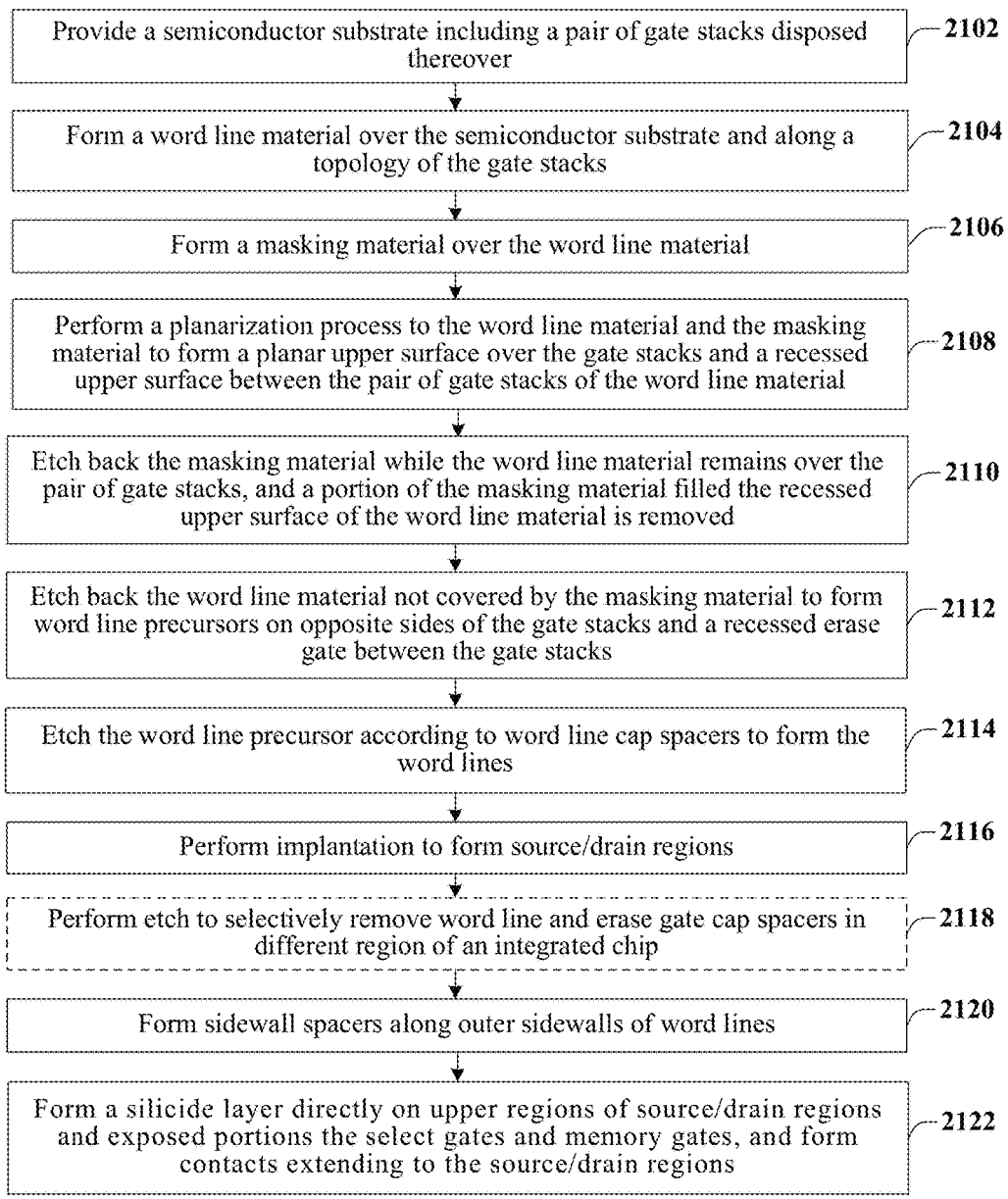
FIG. 21 illustrates a flow diagram of some alternative embodiments of a method of forming a flash memory cell having a word line with a convex upper surface.

FIG. 21 shows some alternative embodiments of a flow diagram of a method 2100 of forming a flash memory device.

At 2102, a semiconductor substrate is provided including a pair of gate stacks disposed thereover.

At 2104, a word line material is formed over the semiconductor substrate and along a topology of the gate stacks.

At 2106, a masking material is formed over the word line material.

At 2108, a planarization process is performed to a word line material and a masking material to form a planar upper surface over gate stacks and a recessed upper surface between the pair of gate stacks of the word line material.

At 2110, the masking material is etched back while the word line material remains over the pair of gate stacks. A portion of the masking material filled the recessed upper surface of the word line material is removed.

At 2112, the word line material not covered by the masking material is etched back to form word line precursors on opposite sides of the gate stacks and a recessed erase gate between the gate stacks.

At 2114, the word line precursor is etched according to word line cap spacers to form the word lines.

At 2116, an implantation process is performed to form source/drain regions within the semiconductor substrate.

At 2118, an etch process is performed to selectively remove the word line cap spacers and the erase gate cap spacers in different regions of an integrated chip.

At 2120, sidewall spacers are formed along outer sidewalls of the word lines.

At 2122, a silicide layer is formed on upper regions of source/drain regions and exposed portions the word lines and erase gate, and contacts are formed within an ILD layer to extend to the source/drain regions.

FIGS. 22-28B show some cross-sectional views of a method of forming a pair of split gate memory cells according to some embodiments. Although FIGS. 22-28B are described in relation to method 2100, it will be appreciated that the structures disclosed in FIGS. 22-28B are not limited to such a method.

Figure 22:
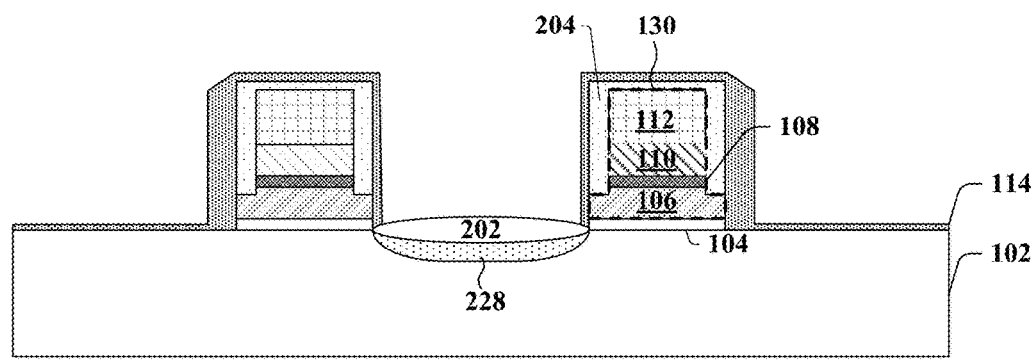
FIGS. 22-28B illustrate some embodiments of cross-sectional views of a method of forming a flash memory cell having a word line with a convex upper surface.

FIG. 22 illustrates some embodiments of a cross-sectional view 2200 corresponding to act 2102. The aspects of cross-sectional view 2200 are described above in relation to FIG. 6.

Figure 23:
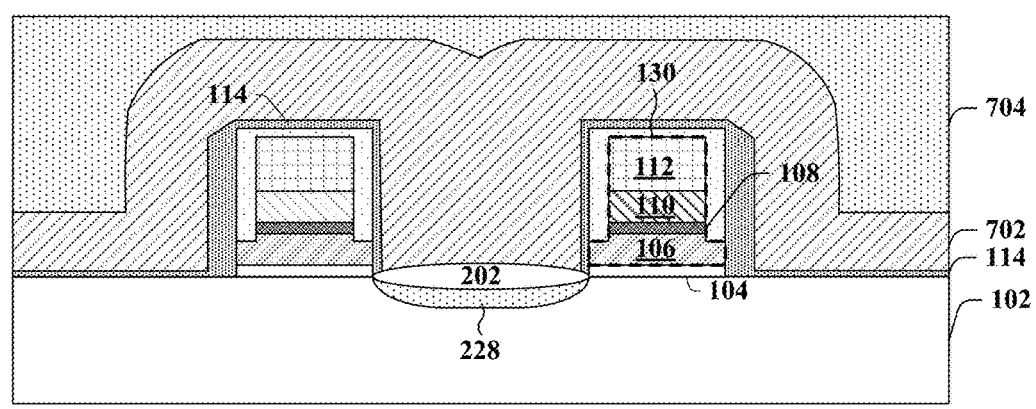

FIG. 23 illustrates some embodiments of a cross-sectional view 2300 corresponding to acts 2104-2106. The aspects of cross-sectional view 2300 are described above in relation to FIG. 7.

Figure 24:
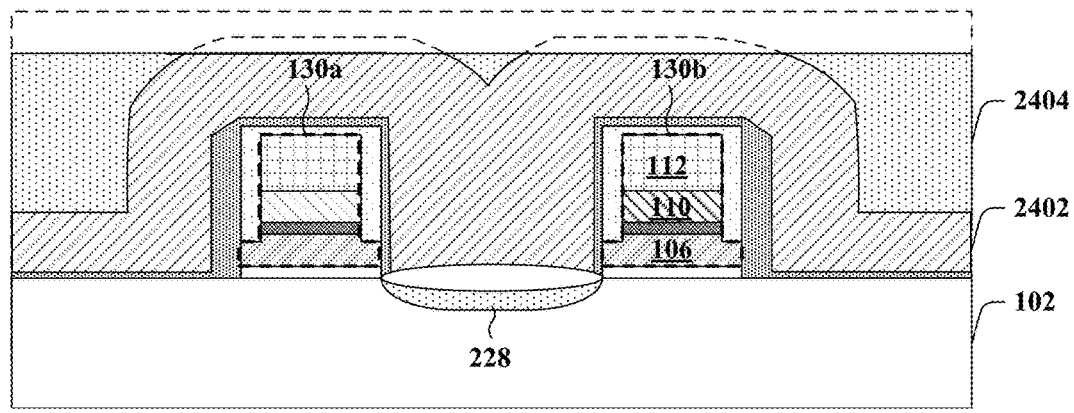

FIG. 24 illustrates some embodiments of a cross-sectional view 2400 corresponding to acts 2108.

As illustrated by cross-sectional view 2400, a planarization process is performed to a word line material 702 and a masking material 704 formed thereon. In some embodiments, the planarization process comprises a dry etching process, which is substantially non-selective to the word line material 2402 and the masking material 2404. In some embodiments, an upper surface of the word line material 2402 comprises a planar portion formed over gate stacks 130 and a recessed portion between the pair of gate stacks 130. A curved sidewall abuts the planar portion of the upper surface of the word line material 2402. The masking material 2404 abuts the recessed portion of the upper surface and the curved sidewall.

Figure 25:
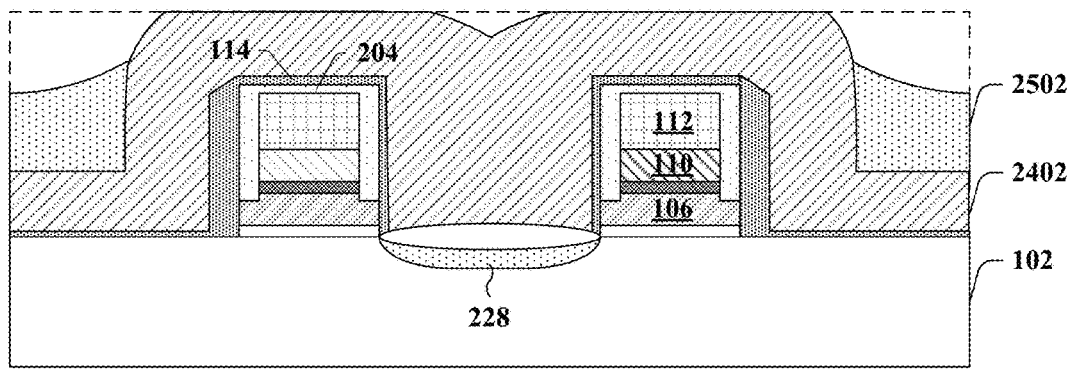

FIG. 25 illustrates some embodiments of a cross-sectional view 2500 corresponding to act 2110.

As illustrated by cross-sectional view 2500, the masking material 2502 is etched back while the word line material 2402 remains over the pair of gate stacks 130. The etched back process can be highly selective to the word line material 2402. The masking material 2502 is lowered to protect a peripheral region of the flash memory device while the curved sidewall of the word line material 2402 is exposed. For example, the masking material 2502 can be etched back by a dry etchant comprising oxygen as one of the react gases. A portion of the masking material 2502 that filled the recessed portion of the upper surface of the word line material 2402 is removed.

Figure 26:
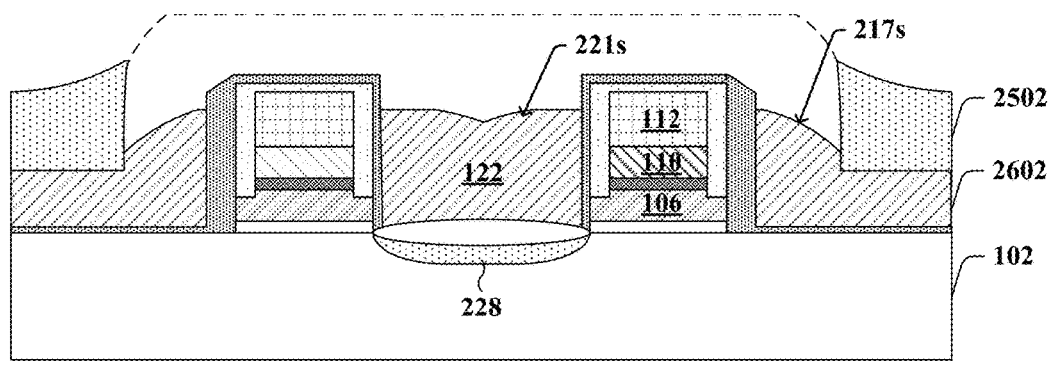

FIG. 26 illustrates some embodiments of a cross-sectional view 2600 corresponding to act 2112.

As illustrated by FIG. 26, the word line material 2402 not covered by the masking material 2502 is etched back to form word line precursors on opposite sides of the gate stacks 130a, 130b and an erase gate 122 between the gate stacks, 130a and 130b. The word line precursor 2602 is formed by etching the word line material 2402 down uniformly and a curved upper surface 217s is formed directly under the previous curved sidewall. The upper surface 217s can have a continuously upwardly sloping contour from an outer side opposite to the gate stack 130 to an inner side closer to the gate stack 130. The erase gate 122 can have an upper surface 221s recessed at a center region, formed by etching a recessed portion of the word line precursor 2602 between the gate stacks 130 down uniformly. The masking material 2502 is then removed.

Figure 27:
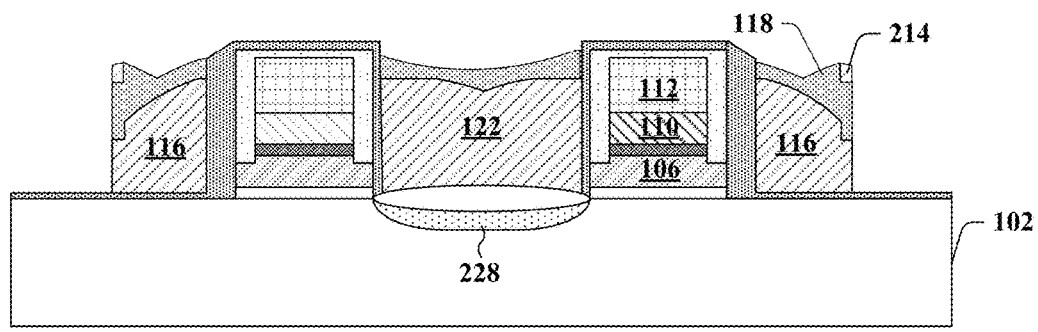

FIG. 27 illustrates some embodiments of a cross-sectional view 2700 corresponding to act 2114.

As illustrated by cross-sectional view 2700, the word line precursors (e.g., 2602 of FIG. 26) are etched according to word line cap spacers 118 to form the word lines 116. Dielectric segments 214 are formed at upper outer edges of the word line cap spacers 118. In some embodiments, the word lines 116 are formed to comprise ledges at outer sides far from the gate stacks which have a lower height than the major portion of the word lines 116.

Figure 28A:
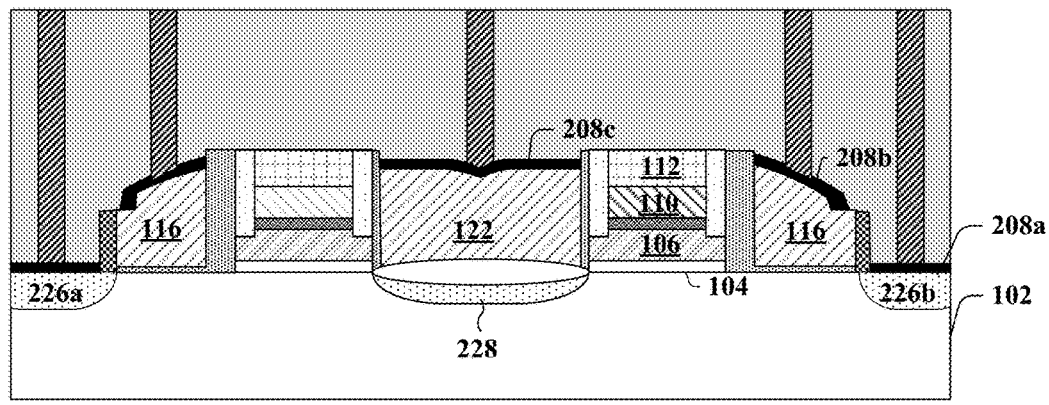
Figure 28B:
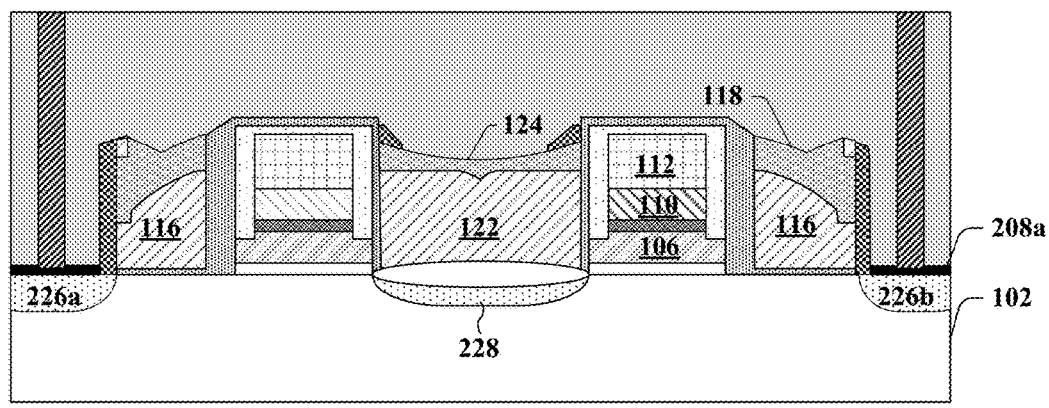

FIGS. 28A-B illustrates some embodiments of cross-sectional views, 2800a and 2800b corresponding to acts 2116-2222.

As illustrated by cross-sectional view 2800a, a silicide layer 208 comprising a first silicide pad 208a, a second silicide pad 208b and a third silicide pad 208c formed respectively on S/D region 126, the word lines 116 and the erase gate 122. Conductive contacts are formed extending to the silicide layer 208.

As illustrated by cross-sectional view 2800b, outside the first region, a silicide pad 208a is formed on the S/D regions 126 while the word line 116 and the erase gate 122 are protected from silicide by the word line cap spacers 118 and an erase gate cap spacer 124.

Thus, the present disclosure provides a self-aligned flash memory device comprising a word line disposed on a side of a gate stack, having an upwardly sloping contour from an outer side opposite to a gate stack to an inner side closer to the gate stack. The shape of the word lines optimizes the contact resistance of the word and provides for a well defined cap spacer that can provide more reliable read/write operations and/or better performance.

In some embodiments, the present disclosure relates to a flash memory device. The flash memory device comprises a gate stack comprising a control gate separated from a floating gate by a control gate dielectric. The flash memory device further comprises an erase gate disposed on a first side of the gate stack. The flash memory device further comprises a word line disposed on a second side of the gate stack that is opposite the first side. The word line has a height that monotonically increases from an outer side opposite to the gate stack to an inner side closer to the gate stack.

In other embodiments, the present disclosure relates to an integrated circuit for a flash memory device. The integrated circuit comprises a common source/drain region shared by a pair of memory cells disposed in a substrate. The integrated circuit further comprises a pair of gate stacks disposed at opposite sides of the common source/drain region over the substrate. The pair of gate stacks respectively comprise a floating gate and a control gate arranged over the floating gate. The integrated circuit further comprises a pair of word lines disposed at opposite sides of the gate stacks as the common source/drain region. Each of the pair of word lines has a height that monotonically increases from an outer side opposite to the gate stack to an inner side closer to the gate stack. The integrated circuit further comprises a pair of sidewall spacers disposed along outer sidewalls of the word lines. The integrated circuit further comprises an erase gate disposed over the common source/drain region between the gate stacks.

In yet other embodiments, the present disclosure relates to a method of forming a flash memory device. The method comprises providing a semiconductor substrate including a pair of gate stacks disposed thereover. The gate stacks include floating gates and control gates arranged over the floating gates. The method further comprises forming a word line material over the semiconductor substrate and along a topology of the gate stacks. The method further comprises forming a masking material over the word line material. The method further comprises performing an etch back of the masking material while the word line material remains over the pair of gate stacks. The method further comprises performing an etch back of the word line material not covered by the masking material to form word line precursors on opposite sides of the gate stacks and an erase gate between the gate stacks. The method further comprises forming word line cap spacers over the word line precursors at positions directly above word lines to be formed. The method further comprises etching the word line material according to the word line cap spacers to form the word lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flash memory device, comprising:
  a gate stack comprising a control gate separated from a floating gate by a control gate dielectric;
  an erase gate disposed on a first side of the gate stack; and
  a word line disposed on a second side of the gate stack that is opposite the first side, wherein the word line has a height that monotonically increases from an outer side opposite to the gate stack to an inner side closer to the gate stack;
  wherein the word line comprises a ledge at the outer side of the word line with a planar upper surface, and a tilted portion at the inner side of the word line.

2. The flash memory device of claim 1, wherein a slope of a top surface of the tilted portion of the word line decreases from the outer side to the inner side of the tilted portion of the word line.

3. The flash memory device of claim 1, wherein the tilted portion of the word line comprises an upper surface having a slope that decreases as a distance from the gate stack decreases.

4. The flash memory device of claim 1, wherein the erase gate has a planar upper surface.

5. The flash memory device of claim 1, further comprising:
- a word line cap spacer disposed on the word line and an erase gate cap spacer disposed on the erase gate; and
- a dielectric segment comprising a different material than the word line cap spacer, which is disposed at an upper outer edge of the word line cap spacer.

6. The flash memory device of claim 1, further comprising:
- a sidewall spacer disposed along an outer sidewall of the word line;
- an interlayer dielectric (ILD) layer arranged over the gate stack, the erase gate and the word line;
- silicide pads arranged over the word line and the erase gate; and
- conductive contacts extending through the ILD layer to the silicide pads.

7. The flash memory device of claim 1, wherein the gate stack further comprises a hard mask disposed over the control gate.

8. The flash memory device of claim 1, wherein the floating gate has a floating gate ledge comprising a reduced height and surrounding a central region of the floating gate, and wherein the flash memory device further comprises a dielectric cap extending from the floating gate ledge over a top surface of the gate stack.

9. The flash memory device of claim 1, further including:
- a second gate stack disposed on an opposite side of the erase gate as the gate stack, wherein the second gate stack comprises a second control gate arranged over a second floating gate; and
- a second word line disposed at a second side of the second gate stack as the erase gate, wherein the second word line has a height that monotonically increases from an outer side opposite to the second gate stack to an inner side closer to the second gate stack.

10. The flash memory device of claim 1, wherein the erase gate and the word line share a crystalline structure.

11. An integrated circuit for a flash memory device, comprising:
- a common source/drain region shared by a pair of memory cells disposed in a substrate;
- a pair of gate stacks disposed at opposite sides of the common source/drain region over the substrate, wherein the pair of gate stacks respectively comprise a floating gate and a control gate arranged over the floating gate;
- a pair of word lines disposed at opposite sides of the gate stacks as the common source/drain region, wherein each of the pair of word lines has a height that monotonically increases from an outer side opposite to the gate stacks to an inner side closer to the gate stacks;
- a pair of sidewall spacers disposed along outer sidewalls of the word lines;
- an erase gate disposed over the common source/drain region between the gate stacks; and
- an erase gate cap spacer disposed over the erase gate, wherein an upper surface of the erase gate cap spacer is recessed.

12. The integrated circuit of claim 11, wherein each of the word lines comprises a ledge portion abutting the corresponding sidewall spacer, the ledge portion has a reduced height relative to a top surface of the word lines.

13. The integrated circuit of claim 12, wherein each of the word lines comprises a tilted portion connecting to the ledge portion, wherein a slope of the top surface of the tilted portion of the word lines decreases from the outer side to the inner side of the tilted portion of the word lines.

14. The integrated circuit of claim 11, further comprising:
- word line cap spacers disposed over the word lines and abutting upper portions of the sidewall spacers.

15. A flash memory device, comprising:
- a gate stack arranged over a substrate and comprising a control gate separated from a floating gate by a control gate dielectric;
- a word line disposed on one side of the gate stack wherein the word line has a height that monotonically increases from an outer side opposite to the gate stack to an inner side closer to the gate stack;
- a word line cap spacer disposed on the word line, including a ledge locating at an upper outer edge of the word line cap spacer; and
- a dielectric segment comprising a different material than the word line cap spacer, which is disposed on the ledge of the word line cap spacer and has an outer sidewall vertically aligned with outer sidewalls of the word line and the word line cap spacer.

16. The flash memory device of claim 15, wherein the word line cap spacer has a concave upper surface, such that a height of the word line cap spacer from the concave upper surface to a surface of the substrate monotonically decreases from a peripheral region to a middle region.

17. The flash memory device of claim 15, wherein the dielectric segment comprised nitride and the word line cap spacer comprises oxide.

18. The flash memory device of claim 15, further comprising:
- an erase gate disposed on a side of the gate stack opposite to the word line;
- wherein the erase gate comprises a planar upper surface.

19. The flash memory device of claim 18, further comprising:
- an erase gate cap spacer disposed on the erase gate;
- wherein the erase gate cap spacer has a concave upper surface such that a height of the erase gate cap spacer from the concave upper surface to a surface of the substrate monotonically decreases from a peripheral region to a middle region.

20. A flash memory device, comprising:
- a gate stack comprising a control gate separated from a floating gate by a control gate dielectric;
- an erase gate disposed on a first side of the gate stack; and
- a word line disposed on a second side of the gate stack that is opposite the first side, wherein the word line has a ledge portion at an outer side opposite to the gate stack and surrounding a tilted portion at an inner side closer to the gate stack;
- wherein the ledge portion has a planar upper surface and a reduced height smaller than a height of the tilted portion at the inner side of the word line.

* * * * *